(12) United States Patent
Seifarth et al.

(10) Patent No.: US 11,515,184 B2
(45) Date of Patent: Nov. 29, 2022

(54) METHOD FOR DETERMINING A SURFACE TEMPERATURE

(71) Applicant: WACKER CHEMIE AG, Munich (DE)

(72) Inventors: Olaf Seifarth, Burghausen (DE); Stefan Sommerauer, Ostermiething (AT); Markus Wenzeis, Wurmannsquick (DE)

(73) Assignee: WACKER CHEMIE AG, Munich (DE)

( * ) Notice: Subject to any disclaimer, the term of this patent is extended or adjusted under 35 U.S.C. 154(b) by 344 days.

(21) Appl. No.: 16/767,943

(22) PCT Filed: Dec. 5, 2017

(86) PCT No.: PCT/EP2017/081551
§ 371 (c)(1),
(2) Date: May 28, 2020

(87) PCT Pub. No.: WO2019/110091
PCT Pub. Date: Jun. 13, 2019

(65) Prior Publication Data
US 2020/0373177 A1 Nov. 26, 2020

(51) Int. Cl.
| | |
|---|---|
| *H01L 21/67* | (2006.01) |
| *G06T 7/62* | (2017.01) |
| *G01J 5/48* | (2022.01) |
| *G06T 7/00* | (2017.01) |
| *C23C 16/24* | (2006.01) |
| *C23C 16/44* | (2006.01) |
| *G01J 5/00* | (2022.01) |

(52) U.S. Cl.
CPC .......... *H01L 21/67248* (2013.01); *G01J 5/48* (2013.01); *G06T 7/0004* (2013.01); *G06T 7/62* (2017.01); *C23C 16/24* (2013.01); *C23C 16/4411* (2013.01); *G01J 5/0007* (2013.01); *G06T 2207/30148* (2013.01)

(58) Field of Classification Search
CPC ...... H01L 21/67; H01L 21/67248; G01J 5/48; G01J 5/0007; G06T 7/0004; G06T 7/62; G06T 2207/30148; C23C 16/24; C23C 16/4411; C30B 35/007; C30B 29/06; C01B 33/035; G01K 1/143
See application file for complete search history.

(56) References Cited

U.S. PATENT DOCUMENTS

| | | | |
|---|---|---|---|
| 4,023,520 A | 5/1977 | Reuschel | |
| 4,309,241 A * | 1/1982 | Garavaglia | ........... C30B 25/025 117/921 |
| 4,444,812 A * | 4/1984 | Gutsche | .................. C30B 25/10 423/349 |

(Continued)

FOREIGN PATENT DOCUMENTS

| | | |
|---|---|---|
| CN | 102795627 B | 12/2013 |
| DE | 2518853 A1 | 11/1976 |

(Continued)

*Primary Examiner* — Tung S Lau
(74) *Attorney, Agent, or Firm* — Brooks Kushman P.C.

(57) ABSTRACT

Siemens process rod growth is controlled by measuring rod diameter by a measuring system A and measuring rod temperature by a measuring system B, the two measuring systems located at different positions outside the reactor.

21 Claims, 4 Drawing Sheets

(56) References Cited

U.S. PATENT DOCUMENTS

| | | | | |
|---|---|---|---|---|
| 4,464,222 | A | * | 8/1984 | Gutsche ................ C01B 33/035 117/102 |
| 6,221,155 | B1 | * | 4/2001 | Keck ................... C23C 16/4418 118/724 |
| 6,544,333 | B2 | * | 4/2003 | Keck ................... C23C 16/4418 117/200 |
| 2002/0014197 | A1 | * | 2/2002 | Keck ....................... C23C 16/24 117/200 |
| 2012/0171845 | A1 | * | 7/2012 | Qin ..................... C23C 16/4418 118/723 R |
| 2012/0322175 | A1 | * | 12/2012 | Pazzaglia ................ C23C 16/52 118/712 |

FOREIGN PATENT DOCUMENTS

| | | |
|---|---|---|
| EP | 2391581 B1 | 1/2013 |
| EP | 2732067 B1 | 1/2016 |
| EP | 2077252 B1 | 2/2017 |

\* cited by examiner

METHOD FOR DETERMINING A SURFACE TEMPERATURE

CROSS REFERENCE TO RELATED APPLICATIONS

This application is the U.S. National Phase of PCT Appln. No. PCT/EP2017/081551 filed Dec. 5, 2017, the disclosure of which is incorporated in its entirety by reference herein.

BACKGROUND OF THE INVENTION

1. Field of the Invention

The invention relates to a method for determining a surface temperature of at least one silicon rod in a chemical vapour deposition reactor during a deposition process. The invention further relates to an arrangement for determining a surface temperature, and to a reactor which comprises such an arrangement.

2. Description of the Related Art

Polycrystalline silicon (polysilicon) is used as a starting material in the production of monocrystalline silicon, by means, for example, of crucible pulling (Czochralski process) or of zone melting (float zone process). The monocrystalline silicon can be sawn into wafers and, after a great many further processing steps, can be used in the semiconductor industry for fabricating electronic components (chips).

Additionally, polysilicon is needed for the production of multi-crystalline silicon, by means of block casting processes, for example. The multi-crystalline silicon obtained in the form of a block can be used for fabricating solar cells. This is done by sawing the silicon blocks in general into rectangular wafers.

Polysilicon is usually produced by means of the Siemens process, a chemical vapour deposition process. In this process, in a bell-shaped reactor (Siemens reactor), thin filament rods (slim rods) of silicon are heated by direct passage of current, and a reaction gas is introduced that comprises a silicon-containing component and hydrogen. The silicon-containing component is usually monosilane ($SiH_4$) or a halosilane of the general composition $SiH_nX_{4-n}$ (n=0, 1, 2, 3; X=Cl, Br, I). A customary component here is a chlorosilane or chlorosilane mixture, usually trichlorosilane ($SiHCl_3$, TCS). Predominantly employed is $SiH_4$ or $SiHCl_3$ in a mixture with hydrogen. The construction of a typical Siemens reactor is described in EP 2 077 252 A2, for example.

The reactor floor generally accommodates electrodes which receive the slim rods. Customarily, two slim rods are each joined by a bridge to form a slim-rod pair or U-rod (a pair of slim rods has the shape of an inverted U), which via the electrodes forms a circuit. The surface temperature of the filament rods is customarily more than 1000° C. These temperatures cause decomposition of the silicon-containing component of the reaction gas, and elemental silicon is deposited from the gas phase, in the form of polysilicon, on the rod surface (chemical vapour deposition, CVD). This produces an increase in the diameter of the slim rods. When a stipulated diameter has been reached, deposition is customarily halted and the resultant U-shaped silicon rods are dismounted. After the bridge of the U-shaped rod pairs has been removed, approximately cylindrical silicon rods are obtained.

The surface temperature of the silicon rods is an important influencing parameter, which during deposition is typically monitored and can be adjusted by varying the passage of electrical current. In principle, the heat flow leaving the silicon rods increases in proportion with the deposition time, owing to the growth in the diameter and hence the surface area of the rods. In the course of deposition, then, an adjustment of the current strength is customarily required. Surface temperatures that are too high result in principle in excessive formation of silicon dust, whereas surface temperatures that are too low lead to retarded deposition or to no further deposition at all. In addition, the surface temperature determines the surface nature and hence the quality of the silicon rods. Higher temperatures do generally lead to more rapid growth of the silicon rods, but the manifestation of an uneven surface increases as the temperature rises.

One known technique for measuring the surface temperature of a silicon rod is to use pyrometers, such as radiation pyrometers. Generally speaking, pyrometers measure the temperature of a measuring point on a surface on the basis of the radiant intensity emitted at a particular wavelength or particular wavelength range. Owing to the heat in the interior of the reactor, measurement is performed in principle from outside the reactor, where the radiation is detected through a viewing window mounted in the reactor wall. In order to ensure undisrupted passage of radiation, the viewing window is generally equipped with specialist optics.

A general problem associated with determining the temperature of only one measuring point is the surface nature of the polysilicon rod. Ideal measuring outcomes can be achieved only on an even surface. In reality, however, the surface of a silicon rod may exhibit furrows and elevations, which may differ greatly in terms of their surface temperature.

EP 2 391 581 B1 discloses a method for measuring the diameter and surface temperature of a silicon rod. In that method, using a pyrometer which is horizontally pivotable about a rotational axis running parallel to the longitudinal axis of the silicon rod, a temperature measurement is performed over time, and at the same time the growth in thickness is measured by horizontal pivoting. Accordingly, a plurality of temperature measurements are performed on a horizontal line.

In the case of pivotable pyrometers, it may happen that further silicon rods within the reactor come into the optical pathway between the pyrometer and the silicon rod under measurement. Furthermore, the internal reactor wall temperature may be detected, producing an error. To block out interfering signals of this kind, procedures are needed which depend on predetermined threshold temperatures and which determine whether the temperature is detected on or adjacent to the silicon rod under measurement. Threshold methods of this kind are more susceptible to disruptions. For example, fluctuations in the gas flows may result in mismeasurements. Moreover, it is generally difficult to distinguish temperatures coming from two rods mounted one above the other, over which pivoting takes place. The diameter determined may be distorted accordingly. A complicating factor is that during deposition, the diameter of the polysilicon rods increases and so the area that is characteristic of the temperature measurement is altered. Moreover, there is a reduction in the distance between the pyrometer and the rod surface, in association with a change in the focus. Another challenge to the measurement of surface temperature are the side regions of the silicon rod. In these regions, reliable capturing of temperatures is customary impossible, since only a small part of the radiation emitted in these regions strikes the detector of a pyrometer.

EP 2 732 067 B1 discloses a method for monitoring the surface temperature of a silicon rod in a CVD reactor by using an image capture device (digital camera or CCD sensor) to record an image of the reactor interior through a viewing window. The temperature is determined by pixel analysis in a target area of constant size in the image. The radiant intensity and thus the temperature of the silicon rod is ascertained where appropriate by comparing the image with the radiant intensity of a reference image. Moreover, on the basis of the pixel analysis (transition from light to dark pixels), it is possible to determine the outer edges of a silicon rod. From these it is possible to calculate the diameter and to specify the position of the target area.

When the surface temperature and the rod diameter are determined using only one image capture device, problems may occur especially when two silicon rods are superimposed. Because the rods customarily have approximately the same temperature, they may in certain circumstances be detected as one rod, and, consequently, the diameter computed may be too great. If the region within which the temperature is analysed is positioned in dependence on the diameter, it may be the case that the curved rod edges in the region of the superimposition are detected, thereby falsifying the temperature analysis. Additionally, a measuring region that has a constant size in terms of area does not take account of the curvature of the rods, which becomes smaller as the silicon rod diameter goes up.

It was an object of the invention to provide a method for measuring the surface temperature of silicon rods, during the operation of a deposition reactor, that overcomes the disadvantages known from the prior art.

SUMMARY OF THE INVENTION

This object is achieved by means of a method for determining a surface temperature of at least one silicon rod in a chemical vapour deposition reactor during a deposition process, wherein a measuring apparatus A determines the surface temperature in a measuring area disposed on the silicon rod, and a measuring apparatus B continuously or discontinuously ascertains at least one diameter of the silicon rod and/or at least one diameter of at least one other silicon rod disposed in the reactor. The size and/or the position of the measuring area on the silicon rod are/is adapted or defined here in dependence on the diameter or diameters ascertained.

DETAILED DESCRIPTION OF THE PREFERRED EMBODIMENTS

Figure 1:
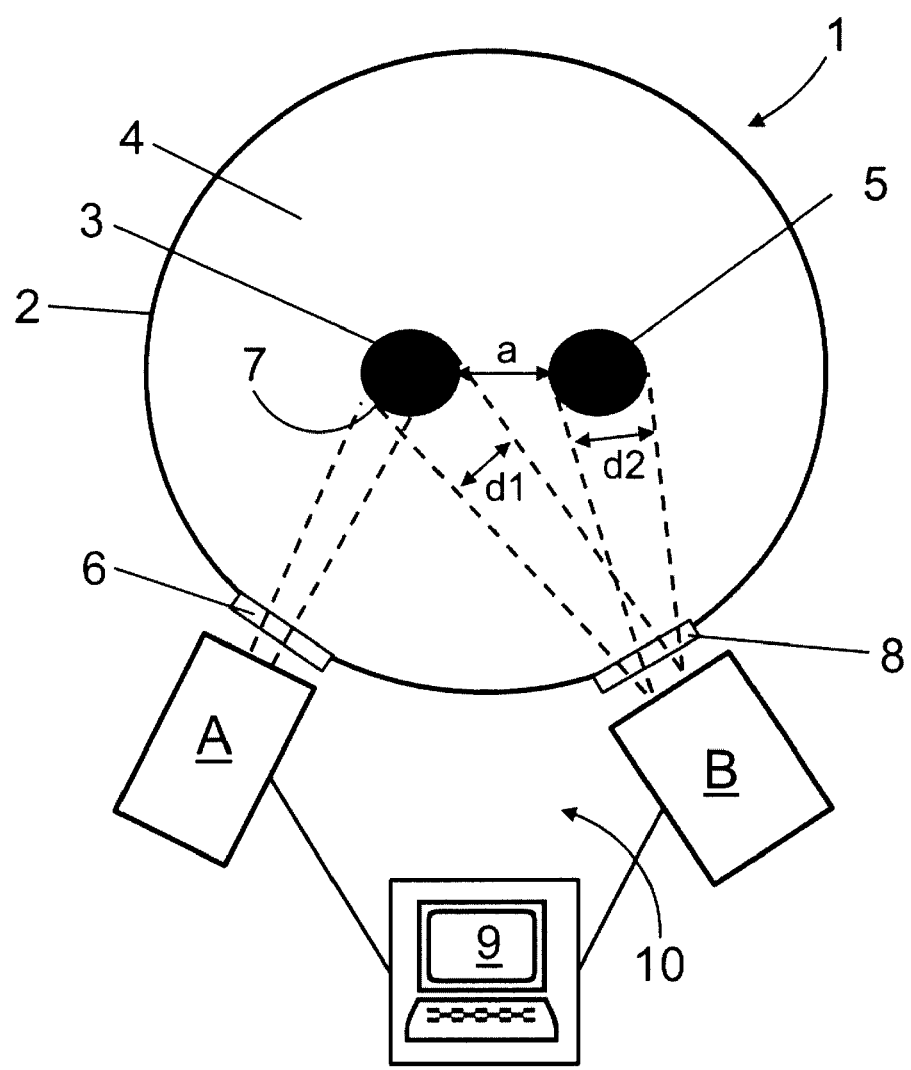
FIG. 1 shows schematically the arrangement for implementing the method of the invention.

The method preferably comprises the following steps:
a) ascertaining at least one diameter of at least one silicon rod with the measuring apparatus B;

b) defining the size and/or the position of the measuring area disposed on the silicon rod, in dependence on the diameter ascertained in step a);
c) determining the surface temperature within the measuring area with the measuring apparatus A;
d) continuously or discontinuously repeating steps a), b) and c), with continuous or discontinuous adaptation of the size and/or the position of the measuring area to the diameter of the silicon rod.

The use of two separate measuring apparatuses A and B enables particularly undisrupted determination of the silicon rod diameter and of its surface temperature. The measuring apparatuses may advantageously be disposed in such a way as to rule out the problem of superimposition of the respective measuring region by other silicon rods. The dynamic adaption of the size of the measuring area to the rod diameter ascertained directly takes account of the curvature of the rod altering as the diameter goes up. Furthermore, the measuring area can be kept particularly large in this way. As a result, the temperature differences on the rod surface, caused by the surface structure, can be compensated more effectively, so that there is no distortion of the measurement result. Through the dynamic adaptation of the position of the measuring area on the silicon rod it is possible to ensure that the measuring area maintains a constant distance from one or both edges of the silicon rod. In particular, the measuring area can be positioned centrally between the rod edges, thereby leaving out the side regions which commonly lead to imprecise measurement results.

The vapour deposition reactor is more particularly a Siemens reactor. The number of silicon rods or silicon rod pairs arranged in the reactor is generally immaterial to the performance of the method of the invention. Typical examples of the number of silicon rods in a reactor are 36 (18 rod pairs), 48 (24 rod pairs) or 54 (27 rod pairs). The silicon rods may be regarded in good approximation as being cylindrical. The slim rods may likewise be cylindrical in form, although other geometries are also possible. It may further be assumed that both the surface temperature and the diameter of all the silicon rods in the reactor are substantially the same, especially when the corresponding measurement values are compared at the same rod height—the middle of the rod, for example. This approximation is justified because modern Siemens reactors are designed to ensure maximum homogeneity of deposition—that is, to generate silicon rods of equal quality and form. This is achieved by a homogeneous gas flow within the reactor and in particular by a substantially symmetrical arrangement of the rods. The rod or rods at which the temperature and diameter are determined is/are generally independent of the number of silicon rods arranged in a reactor. Moreover, a temperature measuring area adapted dynamically to the growth of the silicon rods has the advantage that any temperature differences that do occur are averaged out.

The surface temperature and/or the diameter are/is determined preferably from outside the reactor, through a viewing window. The measuring apparatuses A and B in this case are disposed in particular at different positions, each in front of a viewing window. Preferably, however, the measuring apparatuses are located at the same height, it being immaterial whether the measuring apparatuses are located, for example, at the height of the rod centre or at the height of the upper or lower rod third. For example, the measuring apparatus A may be arranged on the opposite side of the customarily bell-shaped reactor from the measuring apparatus B. The measuring apparatuses are preferably positioned alongside one another (in the circumferential direction of the reactor) each in front of a viewing window. They may also be positioned alongside one another or one above the other in front of a joint viewing window.

Continuous repetition is intended to mean in particular that the diameter is captured and therefore the measuring area and/or the position thereof are/is dynamically adapted in real time throughout the deposition. In the case of discontinuous repetition, capture takes place at specified intervals, on a minutewise or hourly basis, for example.

The measuring apparatus B preferably comprises a camera, more particularly digital camera or CCD camera. The measuring apparatus B preferably is such a camera. The diameter is determined by image processing (more particularly digital image processing) of an image or image detail of the reactor interior that is generated by means of the measuring apparatus B. Provision may also be made for production of a video, in which case, preferably, individual images from the video are subjected to image processing.

Image processing may take place by means of an analog or digital image processing unit, which is preferably part of the measuring apparatus B. More particularly it may involve computer software. The image processing unit may also be a separate device connected to the measuring apparatus B.

The diameter may be determined by selecting the focus of the camera such that at least one silicon rod is visible in its width in front of the inner reactor wall. Generally speaking, on the image obtained in this way, the silicon rod appears light against the inner reactor wall, which appears darker in the background. By means of pixel analysis, the image processing unit is then able to identify a left contour (edge) and a right contour (edge) of the silicon rod and to determine the distance inbetween. The camera is customarily calibrated so that the image it records corresponds in its width to a particular distance in the circumferential direction on the inner reactor wall. The reactor geometry, particularly the reactor circumference at the level of the camera, is fundamental knowledge. The position of the silicon rod and therefore its distance from the inner reactor wall and also from the camera are customarily likewise known. By correlation of the spacings or distances known from the reactor configuration, it is then possible, using the distance lying between the left and right contours of the silicon rod, to compute the rod diameter. The focus of the camera may also be selected in such a way that two or more, more particularly two or three, silicon rods are visible in their full width in front of the inner reactor wall. The measuring principle remains the same.

It is in principle also possible to use the image obtained to measure the distance between two adjacent rods in front of the reactor wall and from that measurement to calculate their diameters, in particular by means of triangulation. In the case of this variant, the two adjacent rods need not necessarily be perceptible each in their full width on the image. Fundamentally, it must be possible to perceive the right edge of the left rod and the left edge of the right rod. By correlation of the spacings or distances known from the reactor configuration, it is then possible to use the spacing of the rods from one another to calculate the diameter.

According to a further embodiment, the measuring apparatus B comprises an arithmetic unit, the diameter being determined from parameters of the deposition process that are captured by means of the arithmetic unit.

The parameters may comprise one or more parameters from the group containing volume flow rate of the reaction gas, deposition temperature, rod current strength, rod voltage, electrical rod resistance, and process time.

The volume flow rate may be determined for example by a flow meter (e.g. suspended-body flow meter) in a line feeding a reaction gas to the reactor. The determination takes place optionally before the feed line branches to feed a plurality of nozzles.

The rod current thickness is the current thickness with which the silicon rod pairs are heated (Joule heating). The rod voltage is the voltage present between a rod pair in order to generate the rod current. The voltage and current strength can be measured by means of commercial measuring instruments. The electrical rod resistance is the heating resistance of the silicon rods. It is calculated from the rod voltage and the current strength. The process time is the time already elapsed from the start of vapour deposition.

The parameter or parameters measured are passed on in particular to the arithmetic unit and are captured by that unit; the rod diameter may be calculated by means of software. For this purpose, customarily by means of a camera of the measuring apparatus B, the diameter is determined at a defined deposition time, more particularly at the start of deposition. The parameters identified above can then be used by the software to calculate the rod diameter in dependence on the deposition time, employing comparison data from previous deposition processes.

The measuring apparatus B may preferably comprise both a camera and an arithmetic unit. The rod diameter can then be determined by both techniques, and the values obtained can be compared with one another. In this way, the risk of measuring errors can be minimized.

The diameter of at least two, more particularly three or four, silicon rods is preferably determined. The different diameters may be determined by one camera, by adjusting the focus of the camera, for example, such that two or more silicon rods can be seen in the image generated (see description above).

It is, however, also possible for two or more cameras, positioned differently around the reactor, to determine the diameter of different rods in accordance with the description above. In that case the cameras are preferably located at different heights. Hence it is also conceivable for two cameras disposed one above the other to determine the diameter of the same rod/rods, albeit at different heights. From the values ascertained for the diameter it is then possible to form an average, thereby additionally increasing the measuring accuracy.

According to a further embodiment, the measuring apparatus A comprises a thermography system, more particularly pyrometer or thermal imaging camera. The measuring apparatus A preferably comprises at least one such thermography system.

The measuring apparatus A is preferably positioned in such a way that the vertically running edges of the silicon rod whose surface temperature is to be determined are not outside the region of focus at the end of the deposition process. The focus of the measuring apparatus A is preferably directed on the silicon rod which is the closest to the measuring apparatus A. Customarily this is the silicon rod which is closest to the viewing window in front of which the measuring apparatus A is positioned. Generally speaking, the position of the viewing window or the position of the rod in the reactor plays no part in the performance of the invention as already described above.

The measuring apparatus A is customarily calibrated at the start of the deposition process such that its measuring area is adapted, in its width, to the diameter of the filament rods used. The measuring area at the start is preferably positioned in the region of the rod centre.

The measuring apparatus A may also comprise an image processing unit for digital or analog image processing. In this way the position of the measuring area may be checked, for example, by pixel analysis and recognition of the left contour (edge) and right contour (edge) of the silicon rod. In this respect, reference may be made to the observations concerning the measuring apparatus B.

The adaptation of the measuring area to the rods growing in diameter as the process time advances is made on the basis of the rod diameter determined by means of measuring apparatus B, and takes place either continuously or discontinuously. This is accomplished preferably by means of a feedback procedure in which, prior to each determination of the surface temperature in the measuring area, the diameter can be retrieved from the measuring apparatus B. For this purpose the measuring apparatuses A and B are preferably coupled to one another, in particular via a controller. The controller makes it possible, for example, to adjust the time intervals in the case of discontinuous adaptation of the measuring area. Furthermore, the geometry of the measuring area and/or the degree of the extension of the measuring area may be adjusted in dependence on the diameter.

The measuring area preferably has a width running perpendicularly to a silicon rod axis, the measuring area being defined in dependence on the rod diameter in such a way that the width is between 2 and 98%, preferably 5 and 95%, more preferably 10 and 90% of the diameter. As a result of the preferably central positioning (between the vertically running edges of the silicon rod) of the measuring area, the marginal regions of the silicon rod are thereby removed from the temperature capture. This increases the accuracy of the measurement, since the thermal radiation in these regions can be captured in principle only to a small extent by a detector of the thermography system.

The measuring area preferably has a height running parallel to the silicon rod axis, the measuring area being adapted in such a way that the height is between 2 and 300%, preferably 5 and 200%, more preferably 10 and 150% of the diameter. The height of the measuring area may also be kept constant. The height of the measuring area preferably increases to the same extent as its width.

The measuring area is preferably rectangular in form. The measuring area may also have a different form. For example, it may be a circle. The latter may then become larger as the rod diameter increases, or, as the time of deposition progresses, an oval measuring area is formed—for example, when the height is kept constant.

According to one preferred embodiment, the surface temperature and the diameter are determined on the same silicon rod.

With preference, it is also possible for two or more measuring apparatuses A to measure the surface temperature on different silicon rods.

According to a further embodiment, a deposition temperature is controlled on the basis of the surface temperature determined in the measuring area. The deposition temperature is a setpoint value of the surface temperature which is to be attained ideally at a defined point in time during the deposition process. The deposition temperature is generally between 900 and 1200° C. and may be varied during the deposition process, in order, for example, to influence the surface nature of the silicon rods. Against this background it is important to have a technique for surface temperature measurement wherein the measurement outcome is not distorted by surface-related extremes. The method of the invention represents such a technique.

Alternatively or additionally, it is also possible for further parameters to be controlled in dependence on the surface temperature measured: for example, volume flow rate of the reaction gas, rod current strength, rod voltage, electrical rod resistance.

According to a further embodiment, the deposition process is ended when a specified rod diameter has been reached.

A further aspect of the invention relates to an arrangement for determining a surface temperature of at least one silicon rod in a chemical vapour deposition reactor during a deposition process, comprising a measuring apparatus B for determining at least one diameter of at least one silicon rod and a measuring apparatus A, coupled with the measuring apparatus B, for determining the surface temperature within a measuring area disposed on the silicon rod, preferably centrally, where the size and/or the position of the measuring area are/is adapted in dependence on the diameter or diameters ascertained, and where the measuring apparatuses A and B are disposed together or independently of one another in front of a viewing window outside the reactor.

The arrangement is suitable more particularly for implementing the method described before. With regard to the design of the arrangement, therefore, it is possible to refer the observations above.

The measuring apparatuses A and B may each be mounted pivotably, more particularly perpendicular to the vertically running silicon rod axis.

The measuring apparatuses A and B are preferably coupled to one another via a controller. The controller may comprise, for example, computer-assisted software. The controller is preferably encompassed by the arrangement.

Furthermore, the arrangement may comprise at least one analog or digital image processing unit. The image processing unit may be connected either to the measuring apparatus A or to the measuring apparatus B, or each of the measuring apparatuses A and B are connected in each case to one such image processing unit.

With preference, the controller for dynamic adaptation of the measuring area and the image processing unit may be present collectively in one system—software, for example. With particular preference, such a system may further comprise the arithmetic unit for parameter-assisted determination of diameters.

An important factor for a maximally error-free and reproducible temperature measurement in the measuring area is a homogeneous and undisrupted optical pathway. It is advantageous if the viewing window and, where appropriate, all optical elements installed therein have a constant optical transmission. Furthermore, the laying-down of deposits on the surfaces of the viewing window and of its components ought to be prevented, especially on the surfaces facing the inside of the reactor. The high temperatures and the introduced gases and liquids during the deposition may also alter the optical properties of the viewing window and of its components (change in optical transmission).

With preference, the viewing window comprises first and second optical elements, the optical elements being spaced apart from one another by a chamber filled with a cooling medium. The first optical element is preferably facing the measuring apparatus, while the second optical element is facing the reactor interior. The temperature drifts can be minimized by the cooling. The optical elements are preferably sheets of glass or fused silica. The two optical elements preferably consist of the same material.

The cooling medium may be a liquid, more particularly water, or a gas (e.g. $H_2$ or $N_2$). The compartment preferably has an inlet and an outlet for the cooling medium, allowing the temperature of the optical elements to be kept constant by a preferably continuous flow of cooling medium.

Preferably, a surface of the second optical element that is directed into the reactor interior is charged with a gas, preferably hydrogen, in such a way as to prevent contact with gases located in the reactor interior. For this purpose, one or more nozzles which blow against the surface continuously or at certain time intervals under a defined pressure may be directed onto the surface directed into the reactor interior. The nozzle or nozzles may also be oriented parallel to the surface, so that, with a continuous flow of gas, a kind of protective layer is formed in front of that surface of the second optical element that is directed into the reactor interior. Alternatively or additionally, there may be at least one nozzle which is oriented in opposition to the surface and which, by means of a continuous flow of gas, displaces the gas approaching from the reactor interior.

A further aspect of the invention relates to a vapour deposition reactor for depositing polycrystalline silicon, comprising a metallic baseplate, a separable and coolable, bell-shaped reactor shell disposed on the baseplate, nozzles for the supply of gas and openings for the removal of reaction gas, electrode mounts for filament rods, and the arrangement described above. The reactor is especially suitable for performing the method of the invention.

FIG. 1 shows a schematic cross-sectional representation of a Siemens reactor 1, comprising an arrangement 10 for determining the surface temperature of a silicon rod 3. The reactor 1 comprises a shell 2 which encloses a reactor interior 4. A reactor shell 2 cooling system has not been shown. Disposed in the shell 2, at the same height, are two viewing windows 6, 8. In front of the viewing window 6 there is a measuring apparatus A, which is a pyrometer. In front of the viewing window 8 there is a measuring apparatus B, which is a digital camera. Both measuring apparatuses, A and B, are also coupled to a system 9 which comprises an image processing unit, a controller for dynamically adapting a temperature measuring area 7, and an arithmetic unit for determination of diameter with the assistance of process parameters. The system 9 is a software-assisted process control station. The measuring apparatuses A and B, the viewing windows 6, 8, and the system 9 form the arrangement 10.

To determine the surface temperature in the measuring area 7 on a silicon rod 3 by means of the measuring apparatus A, the measuring apparatus B first ascertains the diameter of two silicon rods 3, 5. To do this, the measuring apparatus B records an image of the reactor interior 4, with the focus of the camera being adjusted so that both silicon rods 3, 5 are perceptible. The measuring apparatus B may optionally also be arranged pivotably and record an image of each of the silicon rods 3, 5. The image or images obtained are transmitted to the system 9 and, by means of the integrated image processing unit, the contours (left and right edges, indicated by four dashed lines) of the silicon rods 3, 5 are ascertained. On the basis of the distance on the image between the left and right edges, it is possible, as described above, to calculate the diameters d1 and d2 of the silicon rods 3, 5. Alternatively or additionally, the diameters d1 and d2 may also be calculated via the distance a of the silicon rods 3, 5 from one another (see description above). Optionally, further rod diameters are determined on other silicon rods. From the values obtained, an average is formed and is passed on to the controller. The controller then carries out adaptation of the measuring area 7 of the pyrometer to the value obtained, by increasing the width of the measuring area (indicated by two dashed lines), as can be seen from FIG. 2.

Figure 2:
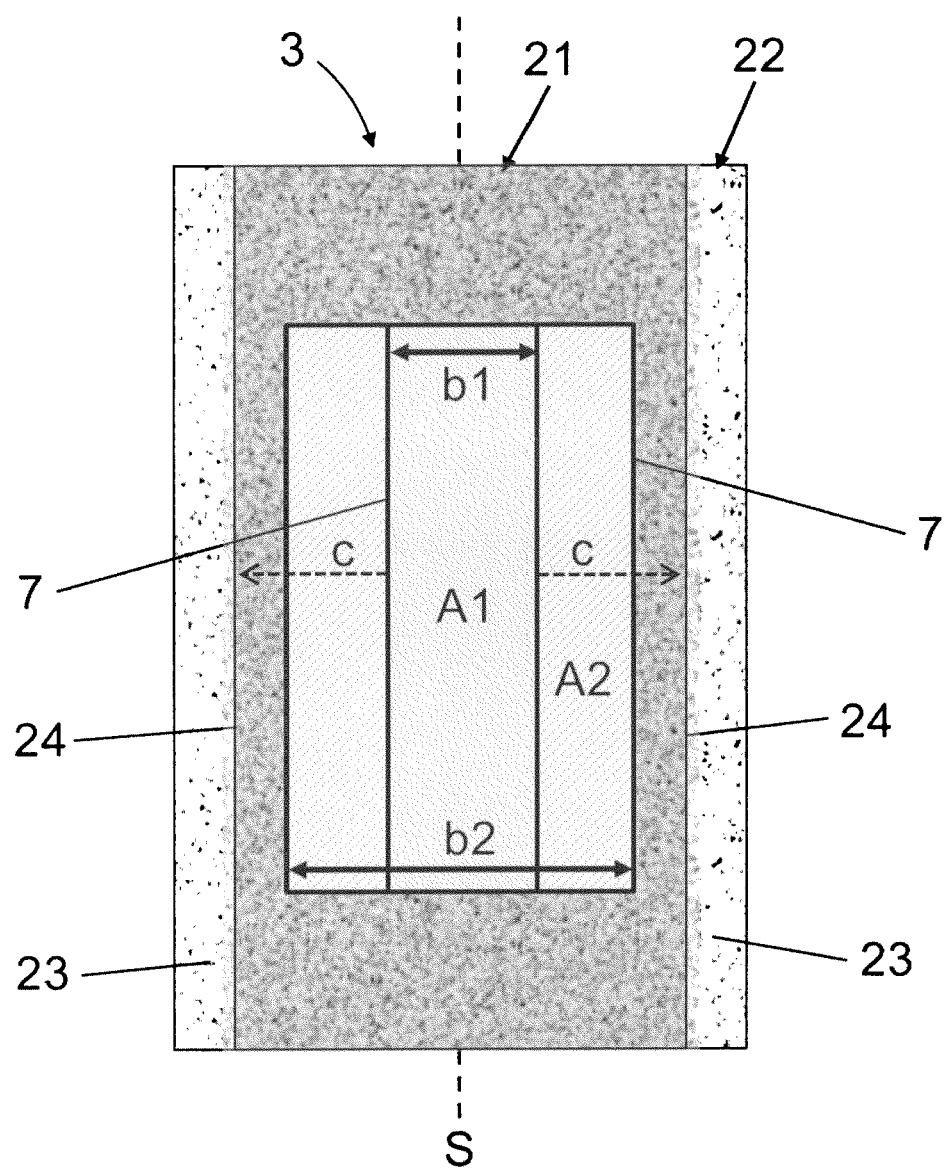
FIG. 2 shows the dynamic measuring area disposed on a silicon rod.

FIG. 2 shows a detail of two thermographic recordings 21, 22 of a section of a silicon rod 3, which were placed one above the other and recorded with the measuring apparatus A (pyrometer). The recording 21 was formed at approximately half of the entire deposition time. The recording 22 was formed shortly before the end of the deposition. The lighter regions 23 correspond to the added growth of polysilicon between the two recordings 21, 22. The area A1 corresponds to the measuring area 7, defined at the start of deposition, for determining the surface temperature of the silicon rod 3. The width b1 of the measuring area 7, running substantially perpendicular to a rod axis S, amounted at this time to about 90% of the width (diameter) of the silicon rod 3. The area A2 corresponds to the measuring area 7 at the time of the recording 21. Its width b2 at this time was approximately 80% of the width (diameter) of the silicon rod 3. The dashed arrows labelled c indicate the continuous adaptation of the measuring area width over the deposition time in dependence on the rod diameter. This adaptation is accomplished by the continuous determination of one or more rod diameters by means of the measuring apparatus B (cf. FIG. 1). The position of the measuring area 7 was adapted so that it lies in the centre of the rod diameter ascertained. The height of the measuring area 7 was constant.

It is readily apparent that the width b2 of the measuring area 7 amounts to only about 80% of the rod diameter. Furthermore, the measuring area 7 is disposed centrally, and so the regions close to the rod edges 24 remain excluded from the temperature measurement. The thermal radiation emitted by the rod surface in these marginal regions can no longer be sufficiently captured by the detector of a pyrometer, and would distort the measurement outcome.

Figure 3:
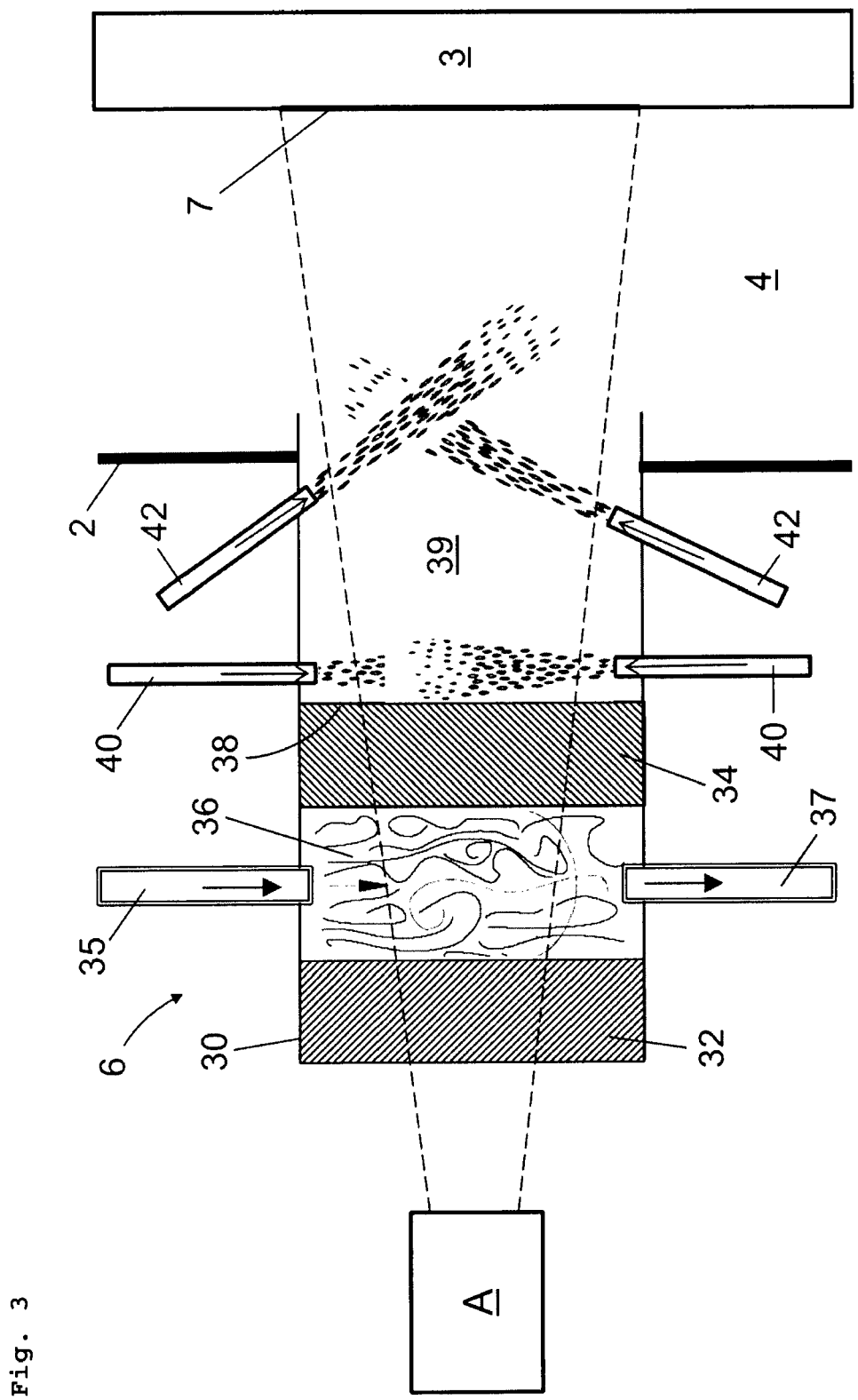
FIG. 3 shows the region of the viewing window of the arrangement for implementing the method of the invention.

FIG. 3 shows a more detailed representation of the viewing window 6 from FIG. 1. The viewing window 6 comprises a first optical element 32 and a second optical element 34, which are disposed in a barrel 30. The barrel 30 is connected to the reactor shell 2 and consists preferably of the same material as the latter. The optical elements 32, 34 are made of fused silica. Located between them is a compartment 36 which is provided with a gas supply line 35 and a gas removal line 37. To cool the optical elements 32, 34, a continuous flow of $N_2$ or $H_2$ is passed through the compartment 36. The optical element 34 has a side 38 facing the reactor interior 4. Disposed parallel to this side 38 and opposite one another are two nozzles 40, which blow hydrogen gas into a region 39 in front of the side 38. The effect of this is firstly to cool the side 38 and secondly to prevent contacting by silicon-containing reaction gases or particles from the reactor interior 4. Any deposits present can likewise be blown off, and for that purpose the nozzles 40 may also be arranged rotatably. Furthermore, additional nozzles 42 are provided that are aligned obliquely in the direction of the reactor interior 4 and which likewise blow hydrogen gas into the region 39. This additionally hinders contact between the side 38 and components from the reactor interior 4.

Figure 4:
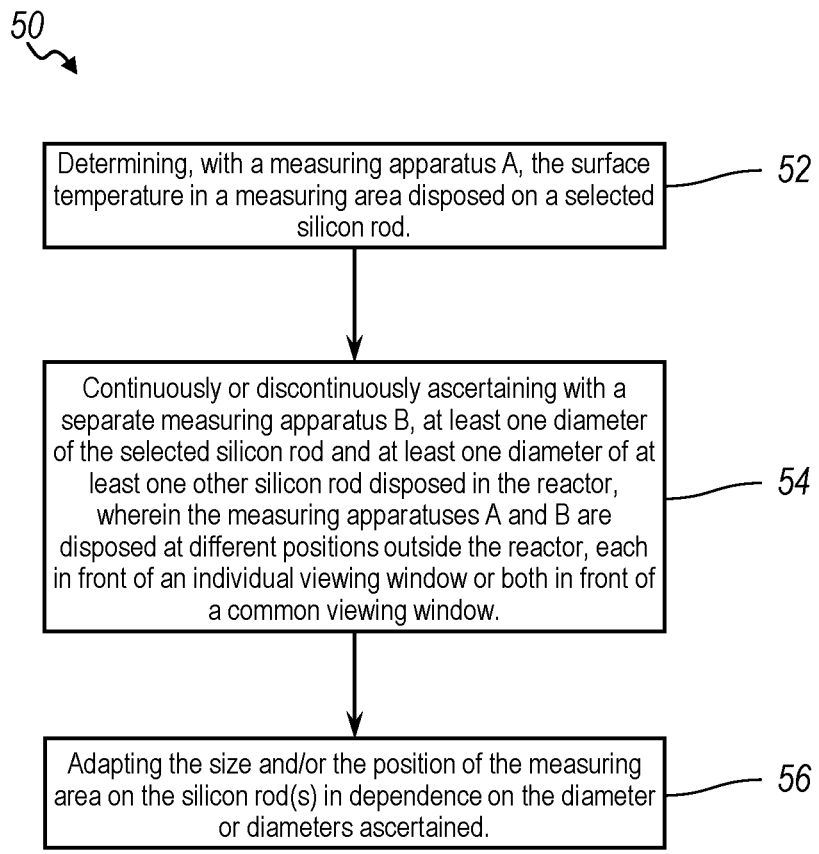
FIG. 4 shows a flow chart illustrating the method of the invention, according to one or more embodiments.

FIG. 4 shows a flow chart depicting a method for determining a surface temperature of at least one silicon rod in a chemical vapour deposition reactor during a deposition process in accordance with one or more embodiments and is generally referenced by numeral 50. While the flowchart is illustrated with a number of sequential steps, one or more steps may be omitted and/or executed in another manner without deviating from the scope and contemplation of the present disclosure. At step 52, a measuring apparatus A determines the surface temperature in a measuring area disposed on the silicon rod. At step 54, a measuring apparatus B continuously or discontinuously ascertains at least one diameter of the silicon rod and/or at least one diameter of at least one other silicon rod disposed in the reactor. Wherein the measuring apparatuses A and B are disposed at different positions outside the reactor, each in front of an individual viewing window or both in front of a common viewing window. At step 56, the size and/or the position of the measuring area on the silicon rod are/is adapted or defined here in dependence on the diameter or diameters ascertained.

The invention claimed is:

1. A method for determining a surface temperature of at least one silicon rod in a chemical vapour deposition reactor containing a plurality of silicon rods during a deposition process, comprising:
   determining, with a measuring apparatus A, the surface temperature in a measuring area disposed on a selected silicon rod, and
   continuously or discontinuously ascertaining with a separate measuring apparatus B, at least one diameter of the selected silicon rod and at least one diameter of at least one other silicon rod disposed in the reactor,
   wherein the measuring apparatuses A and B are disposed at different positions outside the reactor, each in front of an individual viewing window or both in front of a common viewing window, and wherein the size and/or the position of the measuring area on the silicon rod(s) are adapted in dependence on the diameter or diameters ascertained.

2. The method of claim 1, comprising the steps of
   a) ascertaining at least one diameter of at least one silicon rod with the measuring apparatus B;
   b) defining the size and/or the position of the measuring area disposed on the silicon rod, in dependence on the diameter ascertained in step a);
   c) determining the surface temperature within the measuring area with the measuring apparatus A;
   d) continuously or discontinuously repeating steps a), b) and c), with continuous or discontinuous adaptation of the size and/or the position of the measuring area to the diameter of the silicon rod.

3. The method of claim 1, wherein the measuring apparatus B comprises a camera, the diameter being determined by image processing of an image of the reactor interior that is generated by means of the camera.

4. The method of claim 1, wherein the measuring apparatus B further comprises an arithmetic unit, the diameter of the silicone rod being determined from parameters of the deposition process that are captured by means of the arithmetic unit.

5. The method of claim 1, wherein the diameter of at least two silicon rods is determined.

6. The method of claim 1, wherein the diameter of at least three silicon rods is determined.

7. The method of claim 1, wherein the measuring apparatus A comprises a thermography system, more particularly pyrometer or thermal imaging camera.

8. The method of claim 1, wherein the measuring area has a width running perpendicularly to a silicon rod axis, the measuring area being defined such that the width is between 2 and 98% of the diameter.

9. The method of claim 1, wherein the measuring area is rectangular.

10. The method of claim 1, wherein a deposition temperature is controlled on the basis of the measured surface temperature.

11. The method of claim 2, wherein the measuring apparatus B comprises a camera, the diameter being determined by image processing of an image of the reactor interior that is generated by means of the camera.

12. The method of claim 2, wherein the measuring apparatus B further comprises an arithmetic unit, the diameter of the silicone rod being determined from parameters of the deposition process that are captured by means of the arithmetic unit.

13. The method of claim 2, wherein the diameter of at least two silicon rods is determined.

14. The method of claim 3, wherein the measuring apparatus B further comprises an arithmetic unit, the diameter of the silicone rod being determined from parameters of the deposition process that are captured by means of the arithmetic unit.

15. The method of claim 7, wherein the thermography system comprises a pyrometer or a thermal imaging camera.

16. The method of claim 2, wherein the thermography system comprises a pyrometer or a thermal imaging camera.

17. The method of claim 16, wherein the measuring area has a height running parallel to the silicon rod axis, the measuring area being defined such that the height is between 2 and 300%, of the diameter or is constant.

18. A reactor for depositing polycrystalline silicon, comprising a metallic baseplate, a separable and coolable, bell-shaped reactor shell disposed on the baseplate, enclosing a reactor interior, nozzles for the supply of deposition gas and openings for the removal of reaction gas, electrode mounts for filament rods, and an arrangement for determining a surface temperature of at least one silicon rod, the arrangement comprising
   a measuring apparatus B for determining the diameter of at least two silicon rods disposed in the reactor interior;
   a measuring apparatus A, coupled with the measuring apparatus B, for determining the surface temperature within a measuring area disposed on at least one silicon rod;
   at least one viewing window in the reactor shell;
   a processing system to which the measuring apparatuses A and B are coupled,
   the measuring apparatuses A and B being disposed outside the reactor at different positions, each in front of a separate viewing window or both in front of a common viewing window.

19. The reactor of claim 18, wherein the viewing window comprises first and second optical elements spaced apart from one another by a chamber filled with a cooling medium.

20. The reactor of claim 18, wherein the processing system is a software-assisted process control station.

21. The reactor of claim 19, wherein a surface of the second optical element that is directed into the reactor interior can be charged with a gas.

* * * * *